United States Patent
Takayama

(10) Patent No.: US 8,592,851 B2
(45) Date of Patent: Nov. 26, 2013

(54) OPTICAL SEMICONDUCTOR DEVICE AND CIRCUIT

(75) Inventor: Hiroyuki Takayama, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 297 days.

(21) Appl. No.: 11/458,135

(22) Filed: Jul. 18, 2006

(65) Prior Publication Data

US 2007/0176190 A1  Aug. 2, 2007

(30) Foreign Application Priority Data

Jul. 20, 2005 (JP) ................................. 2005-209687

(51) Int. Cl.
*H01L 33/00* (2010.01)

(52) U.S. Cl.
USPC ............. 257/99; 257/675; 257/676; 257/706; 257/713; 257/796; 257/E33.057

(58) Field of Classification Search
USPC ............................................ 257/99, E33.057
See application file for complete search history.

(56) References Cited

U.S. PATENT DOCUMENTS

| | | | |
|---|---|---|---|
| 6,051,848 A * | 4/2000 | Webb | 257/99 |
| 6,158,882 A * | 12/2000 | Bischoff, Jr. | 362/488 |
| 6,396,139 B1 * | 5/2002 | Huang | 257/696 |
| 2005/0151149 A1* | 7/2005 | Chia et al. | 257/99 |
| 2005/0236639 A1* | 10/2005 | Abe et al. | 257/100 |
| 2006/0124953 A1* | 6/2006 | Negley et al. | 257/99 |

FOREIGN PATENT DOCUMENTS

| | | | |
|---|---|---|---|
| EP | 539095 A2 * | 4/1993 | |
| JP | 8-186199 A | 7/1996 | |
| JP | 11-260987 A | 9/1999 | |
| JP | 2001-237353 A | 8/2001 | |
| JP | 2002-176203 A | 6/2002 | |
| JP | 2002208734 A * | 7/2002 | |
| JP | 2002252373 | 9/2002 | |
| JP | 2002314148 | 10/2002 | |
| JP | 3100687 U | 1/2004 | |
| JP | 2004-228387 A | 8/2004 | |

OTHER PUBLICATIONS

Machine translation of Kobayashi, JP 2002208734 A.*
Partial translation of Kobayashi, JP 2002208734 A.*
Japanese Office Action for related Japanese Patent Application No. 2005-209687 dated Nov. 18, 2010.
Japanese Office Action "Decision of Refusal" for related Japanese Patent Application No. 2005-209687 dated Mar. 11, 2011.

* cited by examiner

*Primary Examiner* — Hsin-Yi Hsieh
(74) *Attorney, Agent, or Firm* — Kenealy Vaidya LLP

(57) ABSTRACT

A surface mount optical semiconductor device and circuit can efficiently transfer and dissipate heat even when being mounted together with electronic circuit components. The optical semiconductor device can include a lead frame having a concave portion for mounting a light-emitting element therein and a pair of electrode terminals connected to a board. A sealing resin portion can be provided for sealing a surrounding region of the concave portion. A bottom surface of the concave portion is located at a predetermined distance from a connecting surface on which the pair of electrode terminals is connected to the board. The bottom surface of the concave portion can also be exposed from a bottom surface of the sealing resin portion. Thus, the bottom surface of the concave portion and the device in general can be air-cooled efficiently.

4 Claims, 8 Drawing Sheets

Fig. 2A
Fig. 2B
Fig. 2C
Fig. 2D
Fig. 2E
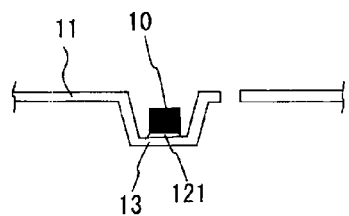
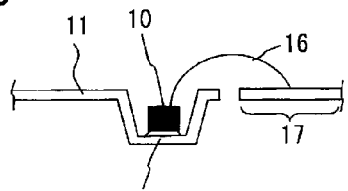
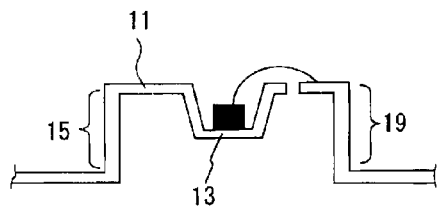
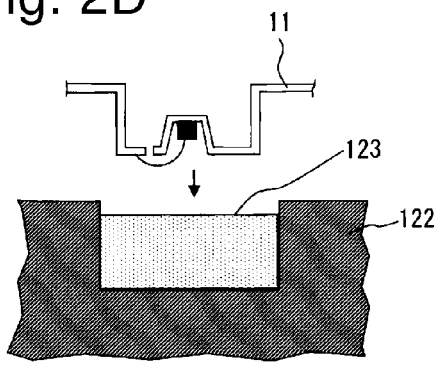
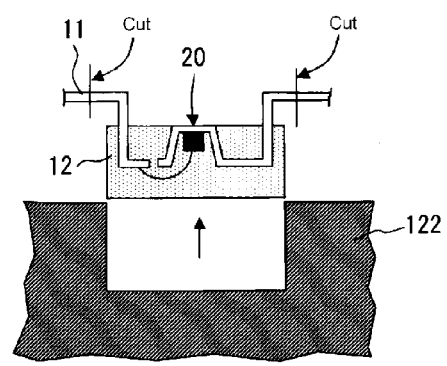

OPTICAL SEMICONDUCTOR DEVICE AND CIRCUIT

This application claims the priority benefit under 35 U.S.C. §119 of Japanese Patent Application No. 2005-209687 filed on Jul. 20, 2005, which is hereby incorporated in its entirety by reference.

TECHNICAL FIELD

The presently disclosed subject matter relates to a surface mount optical semiconductor device and circuit, and in particular, relates to an optical semiconductor device that has excellent heat dissipation properties and is suitable to be mounted on a board together with other electric circuit components.

DESCRIPTION OF THE RELATED ART

An exemplary surface mount light-emitting element is described in Japanese Patent Laid-Open Publication No. 2002-252373. This light-emitting element has a structure that directly conducts heat generated in a light-emitting element chip to a board on which the light-emitting element is mounted. Conduction takes place through a short path in order to improve heat dissipation properties. More specifically, the light-emitting element chip is arranged in a concave portion provided in a lead frame. The concave portion is configured such that the lowermost surface thereof is located at the same height as the electrode terminal of the lead frame. Furthermore, the lowermost surface of the concave portion is exposed from a resin portion that seals the light-emitting element chip and its surroundings. Due to this configuration, when a light-emitting element is mounted on a board and electrode terminals are connected to a wiring pattern on the board via solder or the like, the lowermost surface of the concave portion in which the light-emitting element chip is mounted is in contact with the board. This can facilitate heat dissipation from the light-emitting element chip to the board through the lowermost surface of the concave portion.

Similarly, the technique disclosed in Japanese Patent Laid-Open Publication No. 2002-314148 relates to a light-emitting element configured such that the lowermost surface of the concave portion of a lead frame, in which a chip is mounted, is located at the same height as the electrode terminal. In this configuration, the electrode terminal is bent inward (toward the concave portion) so as to improve the strength of the lead frame. Due to this configuration, it is possible to arrange the resin portion only above an upper portion of the concave portion.

In each of the light-emitting elements described in Japanese Patent Laid-Open Publications Nos. 2002-252373 and 2002-314148, the concave portion in which the chip is mounted is brought in direct contact with the board so as to allow the generated heat to be transferred to the board by heat conduction for dissipation. However, in recent compact electronic circuits for use in devices such as digital cameras, cellular phones that include a camera, and personal digital assistants, for example, not only light-emitting elements, but also other electric circuit components such as an IC chip or a coil that generate a large amount of heat are mounted on the board in a high density format. The heat generated in the electric circuit component(s) may increase the temperature of the board to about 70 to 80° C. At such a high temperature, efficiency of dissipating the heat from the light-emitting element to the board is lowered. In addition, heat of the board may be conducted to the light-emitting element so as to adversely affect light-emitting performance of the light-emitting element.

SUMMARY

One aspect of the presently disclosed subject matter is to provide a surface mount optical semiconductor device that can efficiently dissipate heat even when the device is mounted on a board together with an electronic circuit component(s).

According to another aspect of the presently disclosed subject matter, an optical semiconductor device can be configured to include: a light-emitting element; a lead frame having a concave portion and a pair of electrode terminals connected to a board, the concave portion being configured to mount the light-emitting element therein; and a sealing resin portion configured to seal a surrounding region of the concave portion. A bottom portion of the concave portion can be located a distance from a plane that intersects the pair of electrode terminals such that the bottom portion is configured to be at a predetermined distance from a connecting surface on which the pair of electrode terminals are connected to the board at a predetermined distance, and can be exposed from a bottom surface of the sealing resin portion.

The bottom surface of the sealing resin portion can be located away from the connecting surface by a distance substantially equal to, or larger than, the distance between the bottom portion of the concave portion and the connecting surface.

At least a part of the bottom surface of the sealing resin portion may be configured such that the distance between the bottom surface of the sealing resin portion and the connecting surface becomes larger as a lateral distance from the bottom portion of the concave portion increases. Moreover, the bottom portion of the concave portion can be formed in such a manner that a surface thereof opposed to the connecting surface has a surface area larger than that of a surface area of a portion inside the concave portion on which the light-emitting element is mounted. In addition, the surface of the bottom portion of the concave portion that is opposed to the connecting surface can project toward the connecting surface or have a concavo-convex shape. Due to this configuration, heat dissipation efficiency can be improved.

According to another aspect of the presently disclosed subject matter, an electric circuit device is configured to include a board, a plurality of electric circuit components, and an optical semiconductor device mounted on the board. The aforementioned optical semiconductor device can be used in this embodiment.

According to still another aspect of the disclosed subject matter, another electric circuit device can be provided. The electric circuit device can be configured to include: a board; a plurality of electric circuit components; and an optical semiconductor device, all mounted on the board. The optical semiconductor device can be configured to include: a light-emitting element; a lead frame having a concave portion and a pair of electrode terminals connected to the board, the concave portion configured to mount the light-emitting element therein; and a sealing resin portion configured to seal a surrounding region of the concave portion. The optical semiconductor device can be mounted on the same mounting surface together with the plurality of electric circuit components. The lead frame can be configured to project or be bent toward the board in such a manner that a bottom surface of the concave portion and a bottom surface of the sealing resin portion are located away from a connecting surface on which the optical semiconductor device is mounted on the board. A flowing air layer can be achieved between a surface of the board and the bottom surface of the concave portion of the optical semiconductor device when the device is operated. In this structure, it is possible to effectively cool the bottom surface of the concave portion by the flowing air layer.

BRIEF DESCRIPTION OF THE DRAWINGS

These and other characteristics, features, and advantages of the disclosed subject matter will become clear from the following description with reference to the accompanying drawings, wherein:

FIGS. 2A to 2E show a manufacturing process of the optical semiconductor device and circuit of the exemplary embodiment of FIG. 1A;

DETAILED DESCRIPTION OF EXEMPLARY EMBODIMENTS

Optical semiconductor devices according to various embodiments of the presently disclosed subject matter will now be described with reference to the accompanying drawings.

Figure 1A:
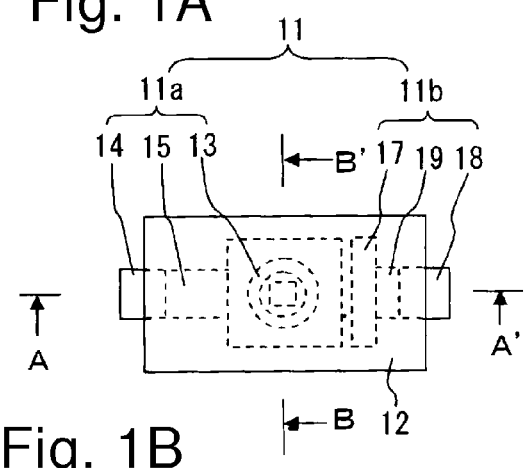
FIG. 1A is a top view of an optical semiconductor device according to an exemplary embodiment of the presently disclosed subject matter.
Figure 1D:
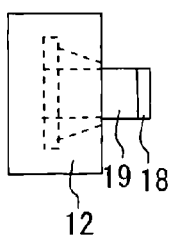
FIG. 1D is a side view thereof.
Figure 1E:
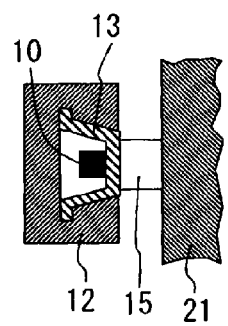
FIG. 1E is a cross-sectional view thereof taken along line B-B' in FIG. 1A.
Figure 1B:
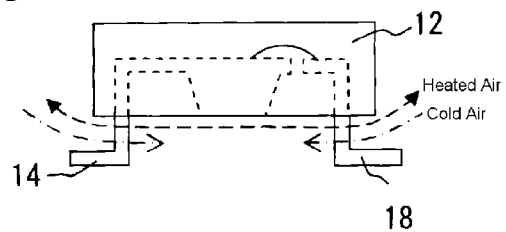
FIG. 1B is a front view thereof.
Figure 1C:
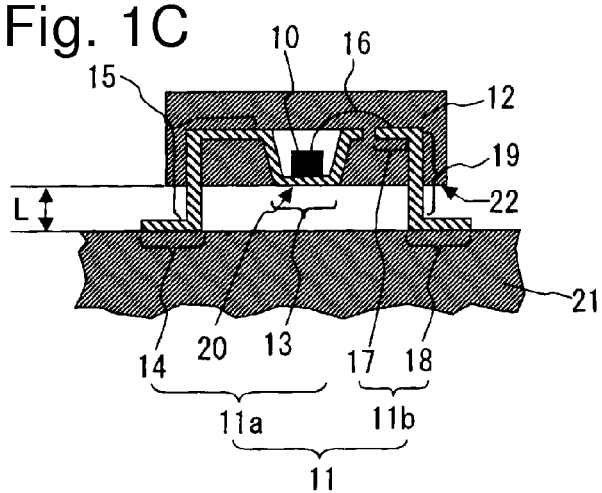
FIG. 1C is a cross-sectional view thereof taken along line A-A' in FIG. 1A.

FIG. 1A is a top view of a surface mount optical semiconductor device and portion of a circuit according to an exemplary embodiment. FIG. 1B is a front view of the surface mount optical device, FIG. 1C is a cross-sectional view thereof taken along line A-A' in FIG. 1A, FIG. 1D is a side view thereof, and FIG. 1E is a cross-sectional view thereof taken along line B-B' in FIG. 1A. The optical semiconductor device can include a light-emitting element 10, a lead frame 11, and a sealing resin portion 12 which is configured to seal a surrounding region of the light-emitting element 10. An LED element can be used as the light-emitting element 10.

The lead frame 11 may be divided into a first lead frame 11a and a second lead frame 11b, as shown in FIG. 1A. The first lead frame 11a may include: a concave portion 13 which is configured for mounting the light-emitting element 10 therein; a first electrode terminal 14; and a connecting portion 15 for connecting the concave portion 13 and the first electrode terminal 14 to each other. The second lead frame 11b may include: a wire connecting portion 17 connected to the light-emitting element 10 via a gold (or similar material) wire 16; a second electrode terminal 18; and a connecting portion 19 for connecting the wire connecting portion 17 and the second electrode terminal 18 to each other.

The light-emitting element 10 can include electrode(s) on its bottom surface and its top surface, respectively. The bottom electrode can be bonded to a bottom surface of the concave portion 13 by die bonding using eutectic solder, silver paste, or the like. The top electrode can be connected to the wire connecting portion 17 via the gold wire 16.

The connecting portion 15 of the first lead frame 11a may be bent, as shown in FIG. 1B, to support the concave portion 13 in such a manner that a bottom surface (lowermost surface) 20 of the concave portion 13 is held at a predetermined height L from the first electrode terminal 14 (see FIG. 1C). The connecting portion 19 of the second lead frame 11b may also be bent and can support the wire connecting portion 17 in such a manner that the wire connecting portion 17 is held at the same height as the top surface of the concave portion 13.

The sealing resin portion 12 can have an outer portion shaped as a rectangular solid and can seal a region adjacent to or surrounding the concave portion 13 of the first lead frame 11a and a region adjacent to or surrounding the wire connecting portion 17 of the second lead frame 11b. A bottom surface 22 of the sealing resin portion 12 can be at the same height as the bottom surface 20 of the concave portion 13 that is exposed from the bottom surface 22 of the sealing resin portion 12. When it is desired that a wavelength of light emitted from the light-emitting element 10 be converted, a wavelength conversion material such as a fluorescent material may be mixed into a resin material for sealing in the concave portion 13.

An operation of the surface mount optical semiconductor device will now be described.

The aforementioned optical semiconductor device can be mounted on a board 21 and the first and second electrode terminals 14 and 18 connected to a pair of electrodes provided on a top surface of the board 21 by soldering or the like, respectively. The bottom surface 20 (i.e., a surface opposed to the board 21) of the concave portion 13 and the bottom surface 22 of the sealing resin portion 12 are located at a height L from the top surface of the board 21. Therefore, there is an air layer flowing between the bottom surface 20 and the board 21.

When power is supplied from the electrodes of the board 21 to the light-emitting element 10 via the first and second electrode terminals 14 and 18, the light-emitting element 10 can emit light. The emitted light passes through an opening of the concave portion 13 and then through the sealing resin portion 12 and finally exits from the top surface of the sealing resin portion 12.

The light-emitting element 10 generates heat when emitting light. The generated heat is conducted to the concave portion 13 of the first lead frame 11a. Since the bottom surface 20 of the concave portion 13 is exposed from the bottom surface 22 of the sealing resin portion 12 and there is a flowing air layer having a thickness L between the bottom surface 20 and the board 21, the heat of the bottom surface 20 is conducted or otherwise dissipated to the flowing air layer. The heated air is located above colder air and escapes upward from both ends of the sealing resin portion 12, as shown in FIG. 1B. Thus, the colder air is caused to move under and contact the sealing resin portion 12. In this manner, the concave portion 13 can be efficiently cooled.

When a fan for circulating and cooling air above the board 21 is provided, an air flow generated by the fan can form the flowing air layer that passes through the gap between the sealing resin portion 12 and the board 21. This can draw the heat from the bottom surface 20 of the concave portion 13, thus achieving a forced cooling.

As described above, the surface mount optical semiconductor device of the present exemplary embodiment can air-cool the bottom surface 20 of the concave portion 13 at least in part due to a structure in which a gap having a width L is formed between the board 21 and the concave portion 13. The temperature of the board 21 may reach about 70 to 80° C. and be thermally saturated because of heat generation in a number of electric circuit elements (or the like) that are mounted together with the above-described surface mount optical semiconductor device. Even in such a case, the optical semiconductor device of the present exemplary embodiment can release the heat of the light-emitting element 10 from the bottom surface 20 of the concave portion 13. Moreover, since the concave portion 13 is located away from the board 21, it is difficult for heat from the board 21 to be conducted, convected or otherwise transmitted back to the concave portion 13 and the light-emitting element 10. Thus, the surface mount optical semiconductor device of the present exemplary embodiment can maintain stable light-emitting properties for the light-emitting element 10.

A manufacturing method of the optical semiconductor device of the above-mentioned exemplary embodiment will now be described with reference to FIGS. 2A to 2E.

First, as shown in FIG. 2A, the lead frame 11 with the concave portion 13 formed therein can be prepared. The light-emitting element 10 is arranged in the concave portion 13 and the bottom electrode of the light-emitting element 10 can be bonded to the concave portion 13 by die bonding using eutectic solder 121, silver paste, or the like.

In FIG. 2B, the top electrode of the light-emitting element 10 is connected to the wire connecting portion 17 of the lead frame 11 by wire bonding using the gold wire 16. When manufacturing an optical semiconductor device that converts the wavelength of light emitted from the light-emitting element 10, the concave portion 13 can be filled with a mixture of a wavelength conversion material such as a fluorescent material and a resin (e.g., an epoxy resin, a silicone resin, or the like) in this step.

Then, the lead frame can be bent to form the connecting portions 15 and 19 (FIG. 2C). A transparent resin material 123 (e.g., an epoxy resin, a silicone resin, or the like) is injected into a resin mold 122 and thereafter the lead frame shown in FIG. 2C is inserted into the resin mold 122 in such a manner that the bottom surface 20 of the concave portion 13 is exposed from a surface of the resin. Alternatively, a transparent resin material may be injected into the resin mold 122 where the lead frame has been set in place in advance (not shown). The transparent resin material is then hardened by heat treatment or the like so as to seal the lead frame and the light-emitting element. Then, the hardened resin is released from the resin mold 122. Thereafter, unnecessary portions of the lead frame 11 can be cut, thereby completing the optical semiconductor device.

By performing the steps shown in FIGS. 2A to 2E, an optical semiconductor device can be manufactured in which the surrounding region of the light-emitting element 10 is sealed with the sealing resin portion 12 and the bottom surface 20 of the concave portion 13 is exposed from the sealing resin portion 12.

Figure 3:
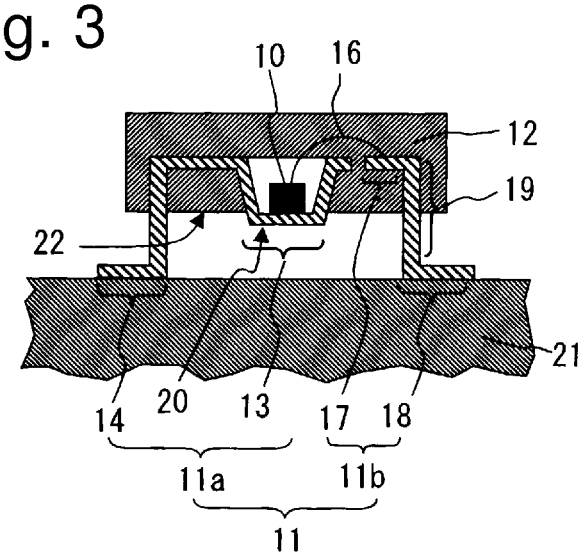
FIG. 3 is a cross-sectional view of another exemplary embodiment of an optical semiconductor device and portion of a circuit.

In the presently described exemplary embodiment, the height of the bottom surface 20 of the concave portion 13 is coincident with the height of the bottom surface 22 of the sealing resin portion 12. However, the configuration of these structures is not limited thereto. For example, the bottom surface 22 of the sealing resin portion 12 may be arranged at a position higher than the bottom surface 20 of the concave portion 13, as shown in FIG. 3. In the presently described embodiment, the bottom surface of the concave portion is not sealed within the sealing resin but, rather, is exposed from the sealing resin to the outside. However, it is conceivable that the concave portion can be covered with resin or other material provided heat dissipation can occur.

Figure 4A:
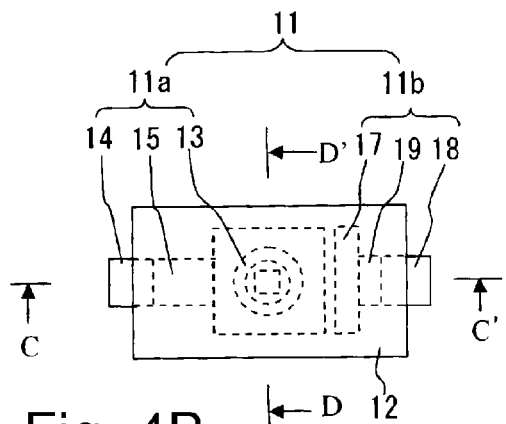
FIG. 4A is a top view of an optical semiconductor device and portion of a circuit according to another exemplary embodiment of the presently disclosed subject matter, in which a portion of or an entire bottom surface is inclined.
Figure 4D:
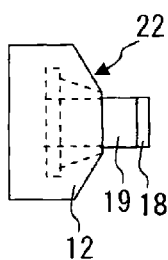
FIG. 4D is a side view thereof.
Figure 4E:
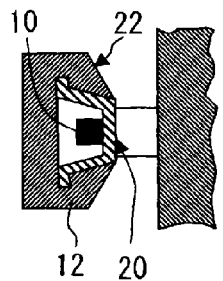
FIG. 4E is a cross-sectional view thereof taken along line D-D' in FIG. 4A.
Figure 4B:
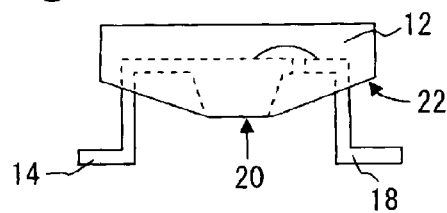
FIG. 4B is a front view thereof.
Figure 4C:
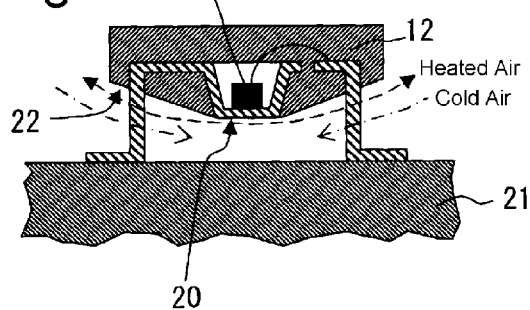
FIG. 4C is a cross-sectional view thereof taken along line C-C' in FIG. 4A.
Figure 5A:
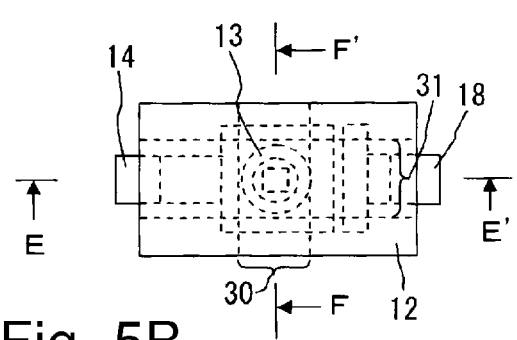
FIG. 5A is a top view of yet another embodiment of an optical semiconductor device and portion of a circuit made in accordance with principles of the disclosed subject matter and in which regions 30 and 31 of the bottom surface are inclined.
Figure 5D:
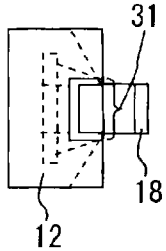
FIG. 5D is a side view thereof.
Figure 5E:
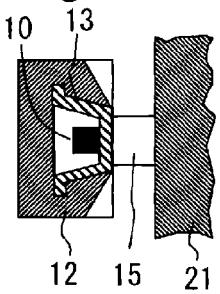
FIG. 5E is a cross-sectional view thereof taken along line F-F' in FIG. 5A.
Figure 5B:
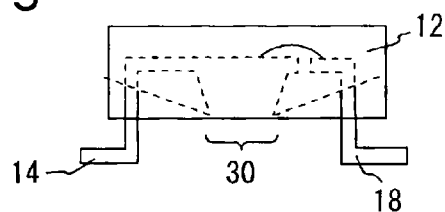
FIG. 5B is a front view thereof.
Figure 5C:
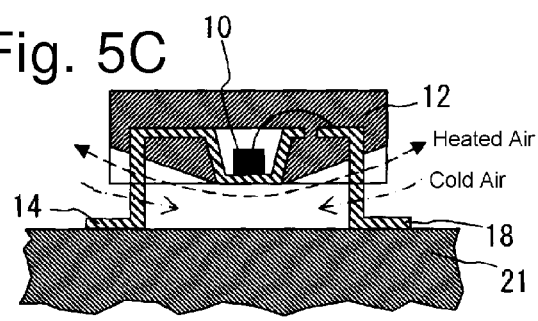
FIG. 5C is a cross-sectional view thereof taken along line E-E' in FIG. 5A.

FIG. 4A is a top view of another embodiment of a surface mount optical semiconductor device and circuit made in accordance with principles of the disclosed subject matter. FIG. 4B is a front view of the surface mount optical semiconductor device of FIG. 4A, FIG. 4C is a cross-sectional view thereof taken along line C-C' in FIG. 4A, FIG. 4D is a side view thereof, and FIG. 4E is a cross-sectional view thereof taken along line D-D' in FIG. 4A.

In the optical semiconductor device and circuit shown in FIGS. 4A to 4E, the same or similar components as those of the optical semiconductor device and circuit of FIGS. 1A to 1E are labeled with the same reference numerals/symbols. The optical semiconductor device shown in FIGS. 4A to 4E has approximately the same structure as that shown in FIGS. 1A to 1E except that the bottom surface 22 of the sealing resin portion 12 can be inclined. In particular, the bottom surface can be configured such that a distance between the bottom surface 22 of the sealing resin portion 12 and the board 21 increases as a lateral distance from the bottom surface 20 of the concave portion 13 increases.

That is, the bottom surface 22 of the sealing resin portion 12 can be inclined to become a convex surface facing toward the board 21, with the bottom surface 20 of the concave portion 13 located at the closest position to the board 21. Thus, air heated by the bottom surface 20 of the concave portion 13 that is located in a gap between the sealing resin portion 12 and the board 21 flows toward the ends of the sealing resin portion 12 while moving along the inclined bottom surface 22 due to the nature of heated air. Thus, the heated air can easily move upward from the ends of the resin portion 12. Therefore, interchange of the heated air and a colder air from surrounding areas can easily occur in the gap between the sealing resin portion 12 and the board 21, thus improving efficiency of dissipating the heat from the device.

In FIGS. 4A to 4E, the entire bottom surface 22 of the sealing resin portion 12 is inclined. Alternatively, only vertically and horizontally extending regions 30 and 31 having the same width as a diameter of the concave portion 13 may be inclined without inclining other regions, as shown in FIGS. 5A to 5E. In the structure shown in FIGS. 5A to 5E, the air heated by the bottom surface 20 of the concave portion 13 can also easily escape upward along the inclined regions 30 and 31. Therefore, the efficiency of dissipating heat can be improved.

The inclined regions are shown as being inclined linearly in FIGS. 4A to 4E and 5A to 5E. However, the inclined regions may be formed with a curved surface, stepped surface, or other surface(s).

Figure 6A:
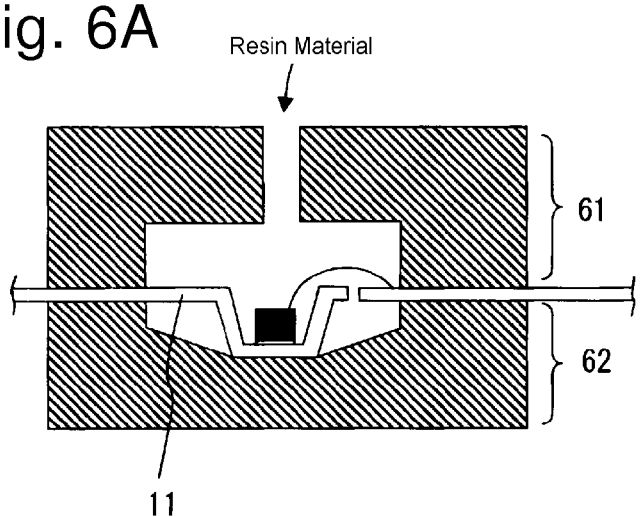
FIGS. 6A and 6B show a manufacturing process for the optical semiconductor device and circuit of FIG. 5A-F.
Figure 6B:
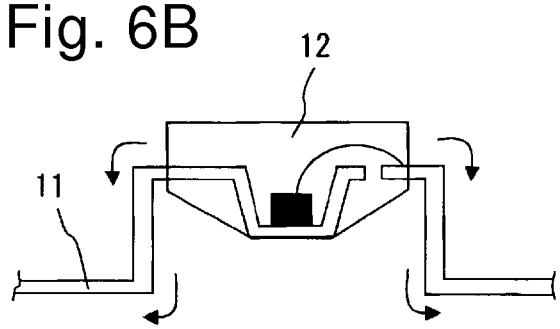

A method for manufacturing the optical semiconductor device shown in FIGS. 4A to 4E and FIGS. 5A to 5E will now be described with reference to FIGS. 6A and 6B.

First, the light-emitting element 10 can be mounted on the lead frame 11 in a similar manner to that in the manufacturing process of the previous exemplary embodiment shown in FIGS. 2A to 2E. The lead frame in a state shown in FIG. 2B or 2C is sandwiched between upper and lower resin mold halves 61 and 62, as shown in FIG. 6A. The resin mold halves 61 and 62 can define an inner cavity for providing inclination to the bottom surface 20 of the concave portion 13. A resin is injected into the resin mold cavity via an injection port and is heated and hardened. Then, the resin mold halves are opened to remove the molded product and the lead frame is bent at an appropriate position, if necessary, as shown in FIG. 6B. Then, unnecessary portions of the lead frame are cut, thereby completing the optical semiconductor device.

It is contemplated that the specific chronology of performance of the steps in the above-described methods can be varied without departing from the spirit of the disclosed subject matter. For example, the lead frame can be bent before the molding step, or the light-emitting element 10 can be bonded or located adjacent the lead frame 11 at a time other than the initial step.

In a further exemplary embodiment, an electronic circuit device in which the optical semiconductor device of the above-described exemplary embodiments is incorporated will be described with reference to FIG. 7.

In this exemplary embodiment, an example in which the electronic circuit device is applied to a portable digital assistant is described. The electronic circuit device can be configured to include a plurality of boards, a liquid crystal display panel, and an operation switch (that are not shown). On one of the boards (board 21), an optical semiconductor device 70, an IC chip 71, a plurality of resistors 72, a plurality of capacitors 73, a transistor 74, and a plurality of jumpers 75 can be mounted with high density, as shown in FIG. 7. A chassis 79 of the portable digital assistant may be provided with a fan 77 for drawing in outside air therein and an exhaust port 78 for air circulation.

Figure 7:
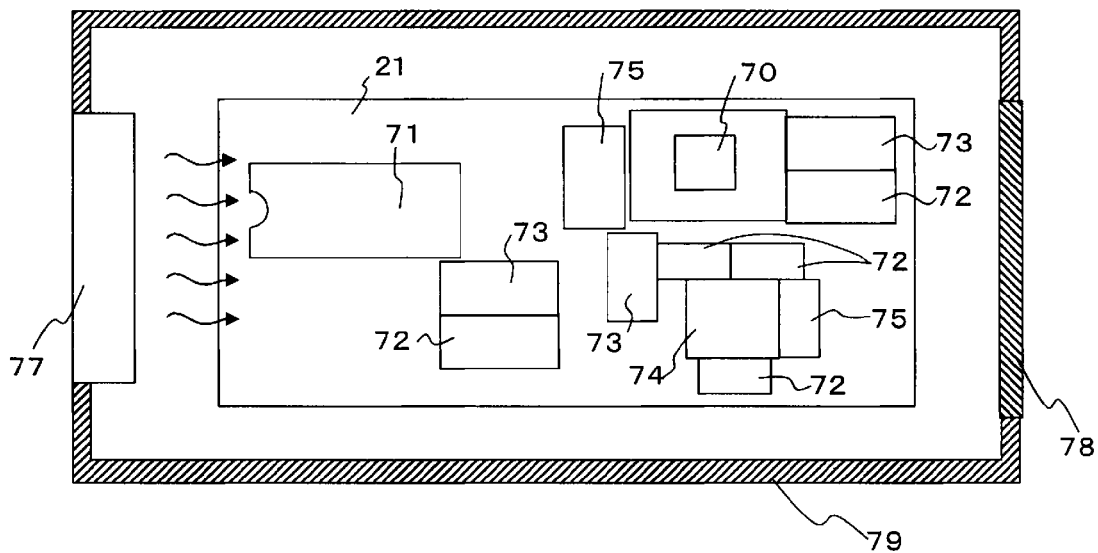
FIG. 7 is a cross-sectional view of an electronic circuit device according to another embodiment of the presently disclosed subject matter.

When any of the optical semiconductor devices of the above-described exemplary embodiments is mounted as the optical semiconductor device 70 in FIG. 7, a gap is formed between the concave portion 13 in which the light-emitting element 10 is mounted and the board 21. Thus, it is possible to dissipate heat generated in the light-emitting element 10 from the bottom surface 20 of the concave portion 13 to air located in the gap so as to achieve air-cooling. In particular, since the structure of FIG. 7 includes the fan 77, air sent from the fan 77 passes through the gap and a forced type of air-cooling is preformed. Therefore, it is possible to more efficiently dissipate heat generated by the light-emitting element 10 to the exhaust port 78 and to the outside. Although the fan 77 and the exhaust port 78 are provided in the device of FIG. 7, they are not essential components. That is, even without the fan 77 and the exhaust port 78, it is possible to dissipate heat by air-cooling in the optical semiconductor device 70 of the present exemplary embodiment described above.

As shown in FIG. 7, a number of electronic circuit components (71 to 75) are mounted on the board 21 and heat from those electronic circuit components may be conducted or otherwise transferred to the board 21. However, the bottom surface 20 of the concave portion 13 in the optical semiconductor device 70 is not in direct contact with the board 21. Thus, it is hard for heat from the board 21 to be conducted/transmitted back to the light-emitting element 10, ensuring stable light-emitting properties.

Figure 8A:
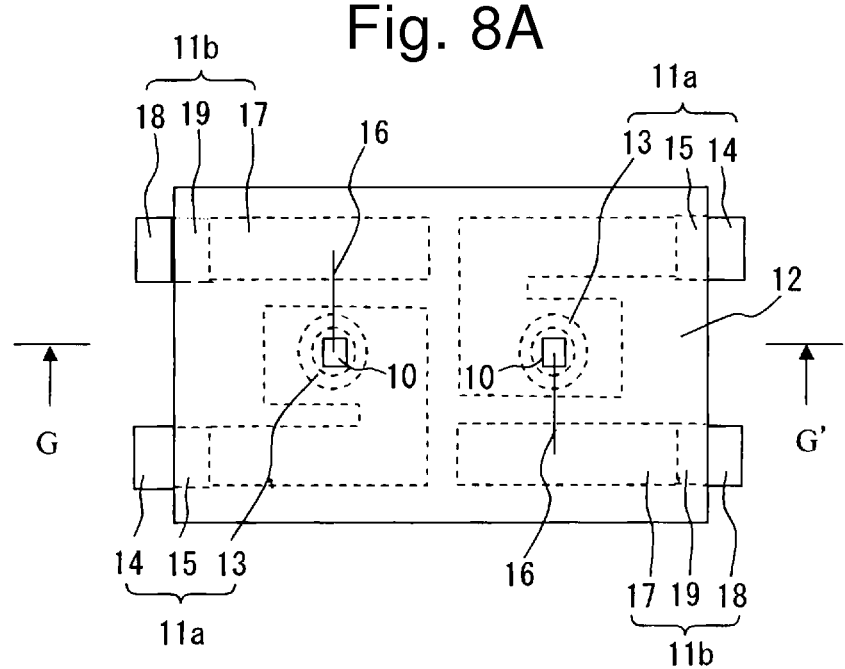
FIG. 8A is a top view of another exemplary embodiment of an optical semiconductor device and portion of a circuit in which two light-emitting elements 10 are incorporated.
Figure 8B:
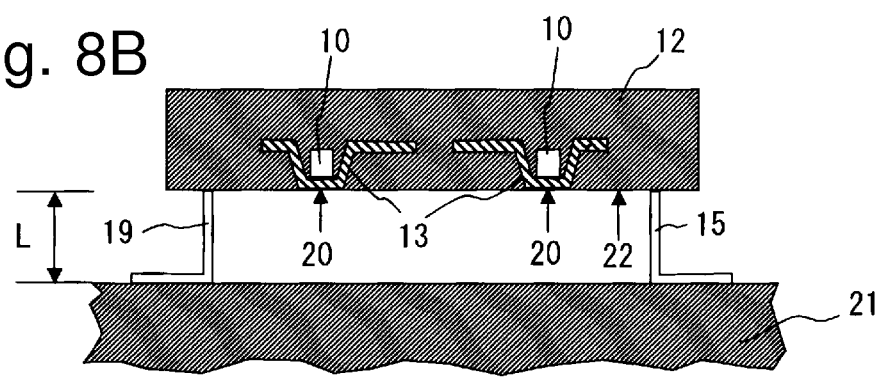
FIG. 8B is a cross-sectional view thereof taken along line G-G' in FIG. 8A.

Although each of the optical semiconductor devices in the above-described exemplary embodiments includes only one light-emitting element 10, an optical semiconductor device in which two or more light-emitting elements 10 are incorporated can be formed. FIG. 8A is a top view of an optical semiconductor device with two light-emitting elements 10 incorporated therein and FIG. 8B is a cross-sectional view thereof taken along line G-G' in FIG. 8A. In FIGS. 8A and 8B, the same or similar components corresponding to those in FIGS. 1A and 1B are labeled with the same reference numerals/symbols and the detailed description thereof is omitted. The optical semiconductor device of FIG. 8A includes two or more light-emitting elements 10 and corresponding bottom surfaces 20 of concave portions 13 that are exposed from the bottom surface 22 of the sealing resin portion 12. The bottom surfaces 20 can be located at a height L from the board 21. Due to this structure, the same or similar effects as those obtained in the previously described exemplary embodiments can be obtained. In addition, the bottom surface 22 of the sealing resin portion 12 in the structure of FIGS. 8A and 8B may be inclined, for example, as in the exemplary embodiment of FIG. 4A-E or FIG. 5A-E (or can include other inclined surface configuration).

Figure 9A:
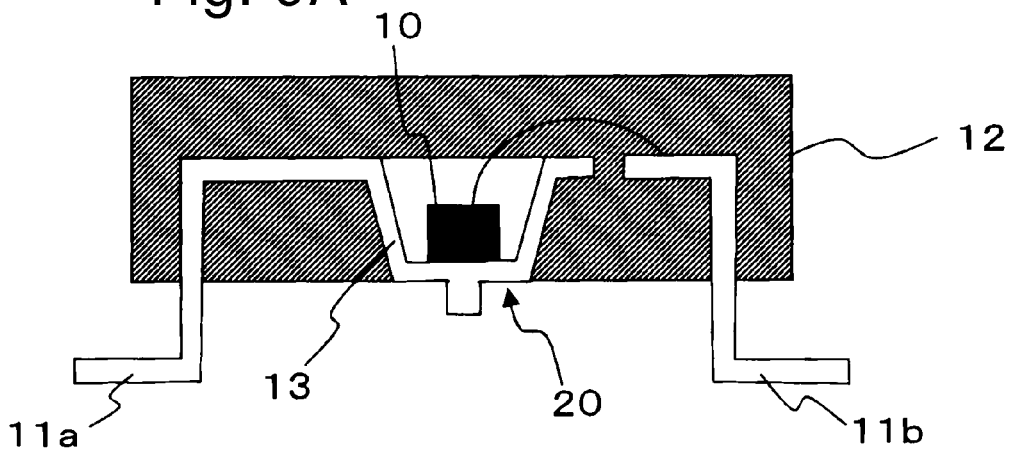
FIG. 9A is a cross-sectional view of an optical semiconductor device of still another exemplary embodiment in which a protruding/convex portion is provided on a bottom surface 20 of a concave portion.
Figure 9B:
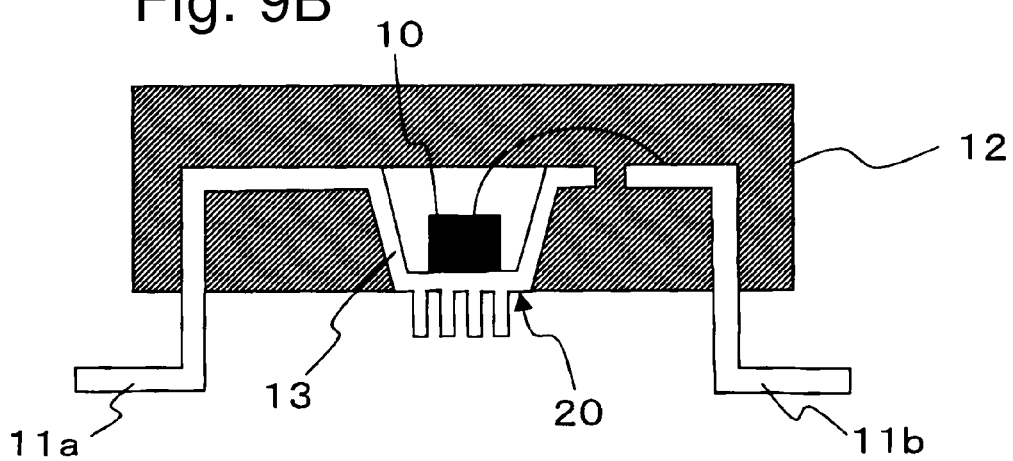
FIG. 9B is a cross-sectional view of another embodiment of an optical semiconductor device in which a radiation fin is provided in the bottom surface 20 of the concave portion.
Figure 9C:
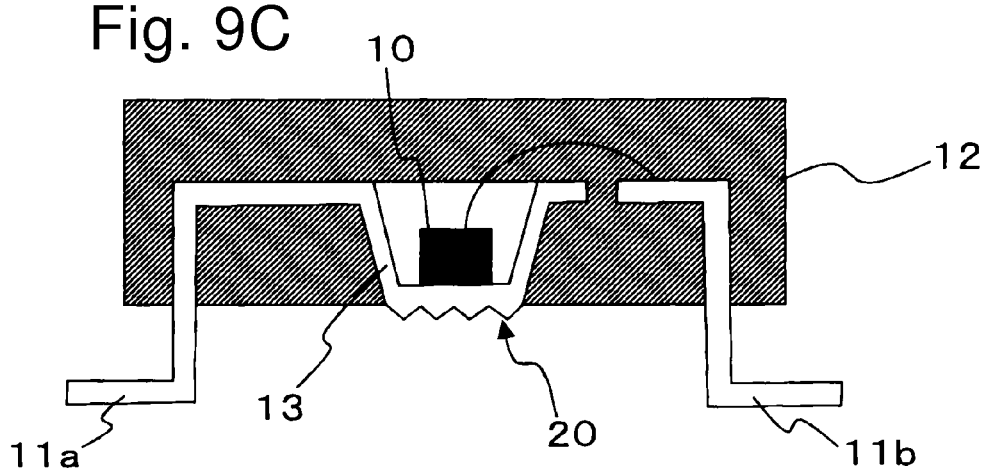
FIG. 9C is a cross-sectional view of another embodiment of an optical semiconductor device in which the bottom surface 20 of the concave portion is roughened.

In the optical semiconductor devices described with respect to the above described exemplary embodiments, the bottom surface 20 of the concave portion 13 is made flat. Alternatively, the bottom surface 20 may project toward the board 21 or have a concavo-convex shape, as shown in FIGS. 9A, 9B, and 9C, thereby increasing the surface area of the bottom surface 20 for heat dissipation. By providing irregularity to the bottom surface 20 of the concave portion 13 to increase its surface area, the heat dissipation efficiency can be further improved. More specifically, FIG. 9A shows an example in which a step-like convex portion is provided on the bottom surface 20 of the concave portion 13 and projects outward. FIG. 9B shows an example in which a concavo-convex pattern, like a radiation fin, is provided on the bottom surface 20. Furthermore, the same or similar effects can also be attained by making the outer bottom surface 20 of the concave portion 13 rough, as shown in FIG. 9C.

Each of the optical semiconductor devices described in the exemplary embodiments shown in the drawing figures has a structure in which the connecting portions 15 and 19 of the lead frame 11 extend from the bottom surface 22 of the sealing resin portion 12 and the bottom surface 20 of the concave portion 13 is supported at a predetermined height L from the board 21. However, the presently disclosed subject matter is not limited thereto. The connecting portions 15 and 19 may extend from side faces or other areas/surfaces of the sealing resin portion 12. Even in this case, it is possible to arrange the bottom surface 22 of the sealing resin portion 12 and the bottom portion 20 of the concave portion 13 at a predetermined height from the board 21 by bending the connecting portions 15 and 19 at appropriate positions or supporting them with supporting means at an appropriate height.

Regardless of whether positions at which the connecting portions 15 and 19 extend from the lead frame 11 are on the bottom surface or on the side surfaces or other surfaces, it may be desirable in certain applications that positions from which the connecting portions 15 and 19 extend from the sealing resin portion 12 be opposed to each other with the sealing resin portion 12 interposed therebetween, as shown in FIGS. 1A to 1E, FIGS. 4A to 4E, and FIGS. 5A to 5E. By arranging the connecting portions 15 and 19 opposed to each other as described above, it is possible to secure a space between them to form a channel for the flowing air layer. Thus, the connecting portions 15 and 19 are not obstacles to the flowing air layer. The air heated by a lower part of the sealing resin portion 12 is released to the outside from end faces on which the connecting portions 15 and 16 are not arranged. Thus, cooling efficiency can be improved.

As described above, according to the described exemplary embodiments, it is possible to provide an optical semiconductor device that can efficiently dissipate heat even when being mounted together with other electronic circuit components that also generate heat.

While there has been described what are at present considered to be exemplary embodiments of the invention, it will be understood that various modifications may be made thereto, and it is intended that the appended claims cover such modifications as fall within the true spirit and scope of the invention. All conventional art references described above are herein incorporated in their entirety by reference.

What is claimed is:

1. An electric circuit device comprising:
a board having a mount surface;
a plurality of electric circuit components mounted on the board; and
an optical semiconductor device mounted on the board, wherein
the optical semiconductor device includes a light-emitting element, a lead frame having a cupped concave portion, a pair of electrode terminals connected to the mount surface of the board, and a pair of connecting portions each connecting the concave portion and at least one of the electrode terminals, the concave portion configured to receive the light-emitting element therein, and a sealing resin portion located adjacent a region of the concave portion, the connecting portions extending away from a bottom-most surface of the sealing resin portion and in a direction towards the board, a bottom-most surface of the concave portion being exposed from the bottom-most surface of the sealing resin portion toward the board, wherein a distance between the bottom-most surface of the sealing resin portion and the mount surface is longer than or equal to a distance between the exposed portion of the bottom-most surface of the concave portion to the mount surface,
the lead frame is configured in such a manner that the bottom-most surface of the concave portion and the bottom-most surface of the sealing resin portion are spaced from the mount surface of the board and the electrode terminals connected to the mount surface such that an air layer is located between the mount surface of the board and the bottom-most surface of the concave portion of the optical semiconductor device, and the bottom-most surface of the concave portion is in contact with the air layer,
wherein the bottom-most surface of the sealing resin portion, completely surrounding the exposed portion of the bottom-most surface of the concave portion in a top view, is entirely inclined with respect to the mount surface to form a convex surface with the exposed portion of the bottom most surface of the concave portion facing the board, the exposed portion of the bottom-most surface of the concave portion located at a position of the convex surface closest to the mount surface with a distance therebetween, and an end of the bottom-most surface of the sealing resin portion is in direct contact with an end of the bottom-most surface of the concave portion,
wherein the bottom-most surface of the concave portion has a surface area that is greater than an upper-most surface of the concave portion to which the light emitting element is attached, and
wherein, when the optical semiconductor device is operation, the air layer is caused to flow under the bottom-most surface of the concave portion.

2. The electric circuit device according to claim 1, wherein the bottom-most surface of the sealing resin portion extends away from the board as the bottom-most surface of the sealing resin portion extends away from the bottom-most surface of the concave portion.

3. The electric circuit device according to claim 1, wherein the bottom-most surface of the concave portion includes a projection that is one of concavo-convex shaped, roughened shaped, and fin shaped.

4. An electric circuit device comprising a board having a mount surface and an optical semiconductor device,
the optical semiconductor device including a light-emitting element, a lead frame having a cupped concave portion, a pair of electrode terminals connected to the mount surface of the board, and a pair of connecting portions each connecting the concave portion and at least one of the electrode terminals, the concave portion configured to receive the light-emitting element therein, and a sealing resin portion located adjacent a region of the concave portion, the connecting portions extending away from a bottom-most surface of the sealing resin portion and in a direction towards the board, a bottom-most surface of the concave portion being exposed from the bottom-most surface of the sealing resin portion toward the board, wherein a distance between the bottom-most surface of the sealing resin portion and the mount surface is longer than or equal to a distance between the exposed portion of the bottommost surface of the concave portion to the mount surface,
the lead frame is configured in such a manner that the bottom-most surface of the concave portion and the bottom-most surface of the sealing resin portion are spaced from the mount surface of the board and the electrode terminals connected to the mount surface such that an air layer is located between the mount surface of the board and the bottom-most surface of the concave portion of the optical semiconductor device, and the bottom-most surface of the concave portion is in contact with the air layer,
wherein at least a part of the bottom-most surface of the sealing resin portion is configured such that the distance between the bottom-most surface of the sealing resin portion and the mount surface becomes larger as a lateral distance from the bottom-most surface of the concave portion increases,
wherein the bottom-most surface of the sealing resin portion is configured such that, in a top view, only vertically and horizontally extending regions having the same width as a diameter of the concave portion extending from the concave portion in directions perpendicular and parallel to a first direction parallel to the mounting surface, respectively, are inclined with respect to the mount surface to form convex surfaces with the exposed portion of the bottom-most surface of the concave portion facing the board, the exposed portion of the bottom-most surface of the concave portion located at a position of the convex surfaces closest to the mount surface, with a distance therebetween, and ends of vertically and horizontally extending regions are in direct contact with ends of the bottom-most surface of the concave portion, wherein the bottom-most surface of the concave portion has a surface area that is greater than an upper-most surface of the concave portion to which the light emitting element is attached, and wherein, when the optical semiconductor device is operation, the air layer is caused to flow under the bottom-most surface of the concave portion.

\* \* \* \* \*